(12) United States Patent
Wang et al.

(10) Patent No.: US 9,172,030 B2
(45) Date of Patent: Oct. 27, 2015

(54) MAGNETO-ELECTRONIC DEVICES AND METHODS OF PRODUCTION

(75) Inventors: Weigang Wang, Baltimore, MD (US); Chia-Ling Chien, Cockeysviile, MD (US)

(73) Assignee: The Johns Hopkins University, Baltimore, MD (US)

(*) Notice: Subject to any disclaimer, the term of this patent is extended or adjusted under 35 U.S.C. 154(b) by 17 days.

(21) Appl. No.: 13/550,415

(22) Filed: Jul. 16, 2012

(65) Prior Publication Data

US 2013/0015542 A1    Jan. 17, 2013

Related U.S. Application Data

(60) Provisional application No. 61/508,372, filed on Jul. 15, 2011.

(51) Int. Cl.
| | |
|---|---|
| *H01L 29/82* | (2006.01) |
| *H01L 43/08* | (2006.01) |
| *H01L 43/10* | (2006.01) |
| *H01L 27/22* | (2006.01) |
| *H01L 43/12* | (2006.01) |
| *H01F 10/32* | (2006.01) |

(52) U.S. Cl.
CPC .............. *H01L 43/08* (2013.01); *H01L 27/222* (2013.01); *H01L 29/82* (2013.01); *H01L 43/10* (2013.01); *H01L 43/12* (2013.01); *H01F 10/3286* (2013.01)

(58) Field of Classification Search
CPC ....... H01L 29/82; H01L 27/222; H01L 43/10; H01F 10/3286
USPC ...................................... 257/421, 441; 438/3
See application file for complete search history.

(56) References Cited

U.S. PATENT DOCUMENTS

| | | | |
|---|---|---|---|
| 6,219,274 B1 | 4/2001 | Shimazawa et al. | |
| 6,479,848 B2* | 11/2002 | Park et al. | ...................... 257/295 |
| 6,621,730 B1* | 9/2003 | Lage | ............................... 365/158 |
| 2002/0164828 A1* | 11/2002 | Ishiwata et al. | .................... 438/3 |
| 2007/0063237 A1 | 3/2007 | Huai et al. | |
| 2008/0008908 A1* | 1/2008 | Ishiwata et al. | ............... 428/811 |
| 2008/0274567 A1 | 11/2008 | Dahmani et al. | |
| 2010/0181633 A1 | 7/2010 | Nam et al. | |
| 2010/0315863 A1 | 12/2010 | Zhu et al. | |

(Continued)

OTHER PUBLICATIONS

Bibes, M. et al., "Multiferroics: Towards a magnetoelectric memory," *Nature Materials* 7, 425-426 (2008).

(Continued)

*Primary Examiner* — David Vu
*Assistant Examiner* — Brandon Fox
(74) *Attorney, Agent, or Firm* — Venable LLP; Henry J. Daley; F. Brock Riggs

(57) ABSTRACT

A magneto-electronic device includes a first electrode, a second electrode spaced apart from the first electrode, and an electric-field-controllable magnetic tunnel junction arranged between the first electrode and the second electrode. The electric-field-controllable magnetic tunnel junction includes a first ferromagnetic layer, an insulating layer formed on the first ferromagnetic layer, and a second ferromagnetic layer formed on the insulating layer. The first and second ferromagnetic layers have respective first and second magnetic anisotropies that are alignable substantially parallel to each other in a first state and substantially antiparallel in a second state of the electric-field-controllable magnetic tunnel junction.

29 Claims, 12 Drawing Sheets

(56) References Cited

U.S. PATENT DOCUMENTS

2011/0303997 A1* 12/2011 Wang et al. .................. 257/421
2012/0280336 A1* 11/2012 Jan et al. ..................... 257/421

OTHER PUBLICATIONS

Butler, W. H. et al. "Spin-dependent tunneling conductance of Fe|MgO|Fe sandwiches," *Physical Review B* 63, 054416 (2001).
Chiba, D. et al. "Magnetization vector manipulation by electric fields," *Nature* 455, 515-518 (2008).
Chiba, D. et al. "Electrical Manipulation of Magnetization Reversal in a Ferromagnetic Semiconductor," *Science* 301, 943-945 (2003).
Choi, Y. S. et al. "Effect of Ta getter on the quality of MgO tunnel barrier in the polycrystalline CoFeB/MgO/CoFeB magnetic tunnel junction," *Applied Physics Letters* 90, 012505-3 (2007.
Chu, Y.-H. et al. "Electric-field control of local ferromagnetism using a magnetoelectric multiferroic," *Nature Materials* 7, 478-482 (2008).
Djayaprawira, D. D. et al. "230% room-temperature magnetoresistance in CoFeB/MgO/CoFeB magnetic tunnel junctions," *Applied Physics Letters* 86, 092502 (2005).
Duan, C.-G. et al. "Surface Magnetoelectric Effect in Ferromagnetic Metal Films," *Physical Review Letters* 101, 137201 (2008).
Endo, M. et al. "Electric-field effects on thickness dependent magnetic anisotropy of sputtered MgO/Co[sub 40]Fe[sub 40]B[sub 20]/Ta structures," *Applied Physics Letters* 96, 212503-3 (2010).
Garcia, V. et al. "Ferroelectric Control of Spin Polarization," *Science* 327, 1106-1110 (Feb. 2010).
Ha, S.-S. et al. "Voltage induced magnetic anisotropy change in ultrathin Fe[sub 80]Co[sub 20]/MgO junctions with Brillouin light scattering," *Applied Physics Letters* 96, 142512-3 (2010).
He, X. et al. "Robust isothermal electric control of exchange bias at room temperature," *Nature Materials* 9, 579-585 (Jun. 2010).
Hur, N. et al. "Electric polarization reversal and memory in a multiferroic material induced by magnetic fields," *Nature* 429, 392-395 (2004).
Ikeda, S. et al." A perpendicular-anisotropy CoFeB—MgO magnetic tunnel junction," *Nature Materials* 9, 721-724 (Jul. 2010).
Lou, J. et al. "Giant Electric Field Tuning of Magnetism in Novel Multiferroic FeGaB/Lead Zinc Niobate-Lead Titanate (PZN-PT) Heterostructures," *Advanced Materials* 21, 4711-+ (2009).
Manchon, A. et al. "Analysis of oxygen induced anisotropy crossover in Pt/Co/MOx trilayers," *Journal of Applied Physics* 104, 043914-7 (2008).
Maruyama, T. et al. "Large voltage-induced magnetic anisotropy change in a few atomic layers of iron," *Nature Nanotechnology* 4, 158-161 (2009).
Miyazaki, T. et al. "Giant magnetic tunneling effect in Fe/Al2O3/Fe junction," *Journal of Magnetism and Magnetic Materials* 139, L231-L234 (1995).
Moodera, J. S., et al. "Large Magnetoresistance at Room-Temperature in Ferromagnetic Thin-Film Tunnel-Junctions," *Physical Review Letters* 74, 3273-3276 (1995).
Nagamine, Y. et al. "Ultralow resistance-area product of 0.4 Omega(mu m)[sup 2] and high magnetoresistance above 50% in CoFeB/MgO/CoFeB magnetic tunnel junctions," *Applied Physics Letters* 89, 162507-3 (2006).
Nakamura, K. et al. "Giant Modification of the Magnetocrystalline Anisotropy in Transition-Metal Monolayers by an External Electric Field," *Physical Review Letters* 102, 187201 (2009).

Negulyaev, N. N. et al. "Electric Field as a Switching Tool for Magnetic States in Atomic-Scale Nanostructures," *Physical Review Letters* 106, 037202 (Jan. 2011).
Niranjan, M. K., et al. "Electric field effect on magnetization at the Fe/MgO(001) interface," *Applied Physics Letters* 96, 222504-3 (2010).
Nishimura, N. et al. "Magnetic tunnel junction device with perpendicular magnetization films for high-density magnetic random access memory," *Journal of Applied Physics* 91, 5246-5249 (2002).
Nozaki, T. et al. "Voltage-induced perpendicular magnetic anisotropy change in magnetic tunnel junctions," *Applied Physics Letters* 96, 022506-3 (2010).
Ohno, H. "A window on the future of spintronics," *Nature Materials* 9, 952-954 (Dec. 2010).
Ohno, H. et al. "Electric-field control of ferromagnetism," *Nature* 408, 944-946 (2000).
Parkin, S. S. P. et al. "Giant tunnelling magnetoresistance at room temperature with MgO (100) tunnel barriers," *Nature Materials* 3, 862-867 (2004).
Ravelosona, D. et al. "Domain Wall Creation in Nanostructures Driven by a Spin-Polarized Current," *Physical Review Letters* 96, 186604 (2006).
Shimabukuro, R. et al. "Electric field effects on magnetocrystalline anisotropy in ferromagnetic Fe monolayers," *Physica E: Low-dimensional Systems and Nanostructures* 42, 1014-1017 (2010).
Shiota, Y. et al. "Voltage-Assisted Magnetization Switching in Ultrathin Fe80Co20 Alloy Layers," *Applied Physics Express* 2, 063001 (2009).
Spaldin, N. A. et al. "The Renaissance of Magnetoelectric Multiferroics," *Science* 309, 391-392 (2005).
Stöhr, J. et al. "Magnetization switching without charge or spin currents," *Applied Physics Letters* 94, 072504-3 (2009).
Sun, J. Z. et al. "Magnetoresistance and spin-transfer torque in magnetic tunnel junctions," *Journal of Magnetism and Magnetic Materials* 320, 1227-1237 (2008).
Tsujikawa, M. et al. "Finite Electric Field Effects in the Large Perpendicular Magnetic Anisotropy Surface Pt/Fe/Pt(001): A First-Principles Study," *Physical Review Letters* 102, 247203 (2009).
Wang, W. G. et al. "Real-time evolution of tunneling magnetoresistance during annealing in CoFeB/MgO/CoFeB magnetic tunnel junctions," *Applied Physics Letters* 92, 152501 (2008).
Wang, W. G. et al. "Understanding tunneling magnetoresistance during thermal annealing in MgO-based junctions with CoFeB electrodes," *Physical Review B* 81, 144406 (2010).
Weisheit, M. et al. "Electric Field-Induced Modification of Magnetism in Thin-Film Ferromagnets," *Science* 315, 349-351 (2007).
Worledge, D. C. et al. "Spin torque switching of perpendicular Ta|CoFeB|MgO-based magnetic tunnel junctions," *Applied Physics Letters* 98, 022501-3 (2011).
Yakushiji, K. et al. "Ultrathin Co/Pt and Co/Pd superlattice films for MgO-based perpendicular magnetic tunnel junctions," *Applied Physics Letters* 97, 232508-3 (2010).
Yoshikawa, M. et al. "Tunnel Magnetoresistance Over 100% in MgO-Based Magnetic Tunnel Junction Films With Perpendicular Magnetic L10-FePt Electrodes," *Magnetics, IEEE Transactions on Magnetics* 44, 2573-2576 (2008).
Yuasa, S. et al. "Giant room-temperature magnetoresistance in single-crystal Fe/MgO/Fe magnetic tunnel junctions," *Nature Materials* 3, 868-871 (2004).

* cited by examiner

MAGNETO-ELECTRONIC DEVICES AND METHODS OF PRODUCTION

CROSS-REFERENCE OF RELATED APPLICATION

This application claims priority to U.S. Provisional Application No. 61/508,372 filed Jul. 15, 2011, the entire contents of which are hereby incorporated by reference.

This invention was made with Government support of Grant No. DMR05-20491, awarded by the National Science Foundation (NSF). The U.S. Government has certain rights in this invention.

BACKGROUND

1. Field of Invention

The field of the currently claimed embodiments of this invention relates to magneto-electronic devices and methods of production, and more particularly to magneto-electronic devices that include an electric-field-controllable magnetic tunnel junction and methods of production.

2. Discussion of Related Art

Magnetic tunnel junctions (MTJs), particularly MgO-MTJs with large tunnel magnetoresistance (TMR), are leading devices for field sensing, nonvolatile magnetic random access memories (MRAMs) and spin logic applications[1-5]. It has been predicted that the electric field can substantially alter the interfacial magnetic anisotropy energy and even induce magnetization reversal in 3d transition ferromagnets (FMs) [6-10], which could possibly provide a more energy efficient route to manipulate the magnetization in MTJs when compared with the spin transfer torque (STT) effect [11]. Indeed, driven by the premise that voltage-controlled switching would be far more energy saving and compatible with the ubiquitous voltage-controlled semiconductor devices[12-15], many studies have been focused on multiferroic materials[16-17], such as electric field controlled spin-polarization[18], antiferromagnetic order[19], and electrostatically tunable ferromagnetic resonance[20]. However, multiferroic materials (e.g. $BiFeO_3$, $BaTiO_3$) are not utilized in spintronics devices. Electric field controlled magnetism has also been demonstrated in diluted magnetic semiconductors such as (Ga,Mn)As and (In,Mn)As, where the ferromagnetism, due to a very different mechanism, is mediated by the carriers.[15] The modification of the carrier density by a gate voltage can result in a change of Curie temperature[21], coercivity[22] and magnetic anisotropy[13], but the very low Curie temperature (<200K) is a serious shortcoming.

Recently, it has been shown that the coercivity $H_C$ of metallic ferromagnetic FePt and FePd films can be modified by up to 4% through the electric field applied at the electrolyte-film interface.[23] This result has triggered intense interest in electric field controlled magnetism in 3d FMs. Subsequently, electric field induced modification of magnetic anisotropy of a single Fe film in all-solid samples has been reported,[24] and further investigated by Brillouin light scattering,[25] Kerr effect,[26] ferromagnetic resonance[27] and anomalous Hall effect[28]. However, the essential feature of resistance switching induced by an electric field has not been realized yet. There thus remains a need for improved magneto-electronic devices.

SUMMARY

A magneto-electronic device according to an embodiment of the current invention includes a first electrode, a second electrode spaced apart from the first electrode, and an electric-field-controllable magnetic tunnel junction arranged between the first electrode and the second electrode. The electric-field-controllable magnetic tunnel junction includes a first ferromagnetic layer, an insulating layer formed on the first ferromagnetic layer, and a second ferromagnetic layer formed on the insulating layer. The first and second ferromagnetic layers have respective first and second magnetic anisotropies that are alignable substantially parallel to each other in a first state and substantially antiparallel in a second state of the electric-field-controllable magnetic tunnel junction. A current of tunneling electrons through the insulating layer is greater in the first state than the second state, and a voltage applied between the first and second electrodes causes a change in at least one of a magnetic anisotropy energy, coercivity or domain wall velocity of at least one of the first and second ferromagnetic layers or a tunneling potential energy barrier through the insulating layer to at least assist in changing the electric-field-controllable magnetic tunnel junction from at least one of the first and second states to the other of the first and second states.

An electric-field-controllable magnetic tunnel junction according to an embodiment of the current invention includes a first ferromagnetic layer, an insulating layer formed on the first ferromagnetic layer, and a second ferromagnetic layer formed on the insulating layer. The first and second ferromagnetic layers have respective first and second magnetic anisotropies that are alignable substantially parallel to each other in a first state and substantially antiparallel in a second state of the electric-field-controllable magnetic tunnel junction. A current of tunneling electrons through the insulating layer is greater in the first state than the second state. An electric field applied to the electric-field-controllable magnetic tunnel junction causes a change in at least one of a coercivity of at least one of the first and second ferromagnetic layers or a tunneling potential energy barrier through the insulating layer to at least assist in changing the electric-field-controllable magnetic tunnel junction from at least one of the first and second states to the other of the first and second states.

A method of producing a magneto-electronic device according to an embodiment of the current invention includes forming a first electrode on a substrate, forming a first ferromagnetic layer on the first electrode, forming an insulating layer on the first ferromagnetic layer, forming a second ferromagnetic layer on the insulating layer, and forming a second electrode on the second ferromagnetic layer. The forming the insulating layer forms a layer of MgO that has a thickness of at least 1.0 nm and less than 2.0 nm. The forming the first ferromagnetic layer forms a layer of $Co_{40}Fe_{40}B_{20}$ that has a thickness of at least 1.0 nm and less than 1.5 nm, and the forming the second ferromagnetic layer forms a layer of $Co_{40}Fe_{40}B_{20}$ that has a thickness of at least 1.5 nm and less than 1.8 nm.

BRIEF DESCRIPTION OF THE DRAWINGS

Further objectives and advantages will become apparent from a consideration of the description, drawings, and examples.

FIG. 2A (a): Schematic drawing of a p-MTJ and the effect of electric field via a small voltage supplied by a battery. FIG. 2B (b): TMR curves under different bias voltages. FIG. 2C (c): Dependence of the coercivities for the top and bottom CoFeB layers on electric field. Inset shows the TMR curves of an in-plane MTJ under opposite bias voltages.

FIG. 4A, (a): Dependence of TMR and zero electric field coercivity of the bottom CoFeB layer on MgO barrier thickness. Inset shows the WKB fitting of the parallel and antiparallel resistance for determining the decay rate in the MgO barriers. FIG. 4B, (b): Electric field dependence of the coercivity of top CoFeB layer with linear fitting for the positive field branches. FIG. 4C, (c): Electric field dependence of the coercivity of bottom CoFeB layer.

FIG. 5A, (a): Normalized minor loops of the TMR curve at different $V_{bias}$. Inset show the full TMR curve at near zero $V_{bias}$ where both FM layers are switched by magnetic field. This MTJ has the structure of CoFeB(1.3 nm)/MgO (1.2 nm)/CoFeB(1.6 nm). FIG. 5B, (b): Unipolar switching of the MTJ by a series of negative pulses (schematically shown in at bottom) with alternative amplitude of −0.9V and −1.5V. The corresponding electric fields are −0.75V/nm and −1.25V/nm, respectively. A constant biasing magnetic field of 55 Oe was applied. FIG. 5C, (c): Schematic diagram of the hysteresis loops of top CoFeB layer showing the unipolar switching process: magnetization-down→up switching at V=$V_1$(Red) via STT with greatly reduced energy barrier; magnetization→up down switching at V=$V_2$ (Black) by another negative electric field, where $|V_2|>|V_1|$. The loop for V=0 is shown in Blue. Vertical dotted line represents the position of the constant $H_{bias}$. The moment of bottom CoFeB is fixed pointing down.

FIGS. 10A, (a): Hard-axis TMR curve of a MTJ with the key structure of CoFeB(1.2 nm)/MgO(1.8 nm)/CoFeB(1.6 nm) under in plane magnetic field. FIGS. 10B, (b): Magnetization of the Ta(7 nm)/Ru(15 nm)/Ta(7 nm)/CoFeB(1.2 nm)/MgO(1.8 nm) unpatterned film under in plane and out of plane magnetic field. The inset shows the electric field dependence of saturation field by hard-axis TMR measurement (corresponding to the anisotropy field of the bottom CoFeB layer) and the $H_C$ of the bottom CoFeB layer by easy-axis TMR measurement.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

Figure 1:
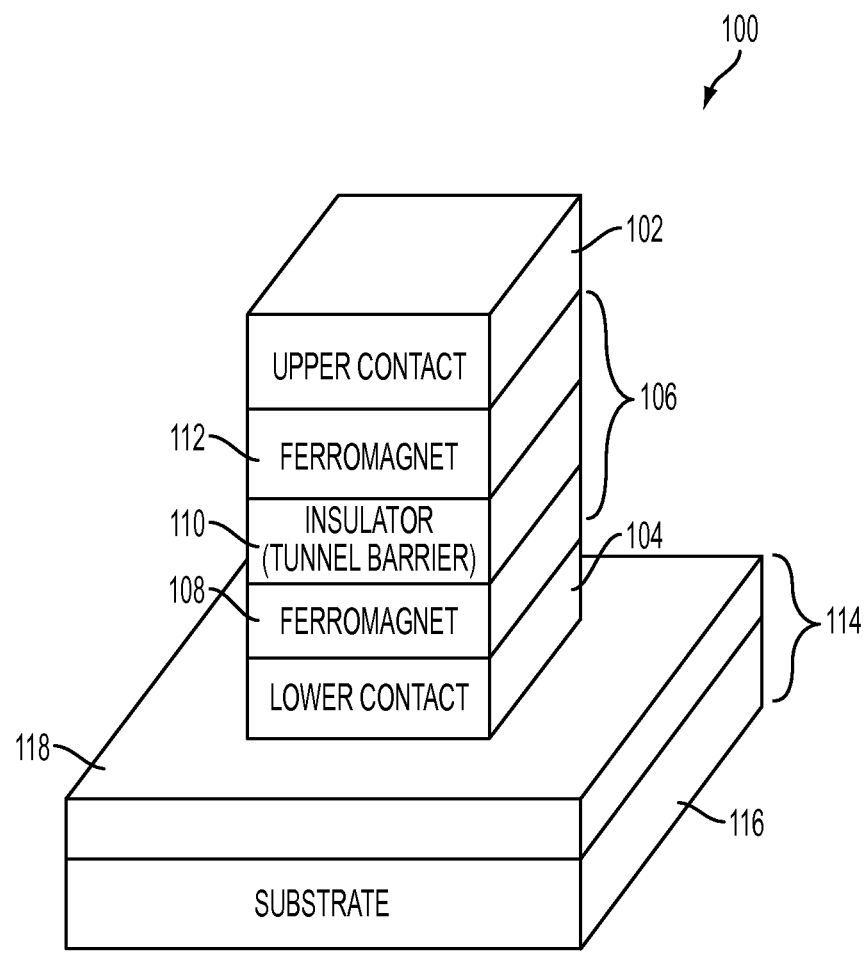
FIG. 1 is a schematic illustration of a magneto-electronic device according to an embodiment of the current invention.

FIG. 1 provides a schematic illustration of a magneto-electronic device 100 according to an embodiment of the current invention. The magneto-electronic device 100 includes a first electrode 102, a second electrode 104 spaced apart from the first electrode 102, and an electric-field-controllable magnetic tunnel junction 106 arranged between the first electrode 102 and the second electrode 104. The electric-field-controllable magnetic tunnel junction 106 includes a first ferromagnetic layer 108, an insulating layer 110 formed on the first ferromagnetic layer 108, and a second ferromagnetic layer 112 formed on the insulating layer 110. The first and second ferromagnetic layers (108, 112) have respective first and second magnetic anisotropies that are alignable substantially parallel to each other in a first state and substantially antiparallel in a second state of the electric-field-controllable magnetic tunnel junction 106. A current of tunneling electrons through the insulating layer is greater in the first state than in the second state. A voltage applied between the first and second electrodes (102, 104) causes a change in at least one of a magnetic anisotropy energy, coercivity or domain wall velocity of at least one of the first and second ferromagnetic layers (108, 112) or a tunneling potential energy barrier through the insulating layer 110 to at least assist in changing the electric-field-controllable magnetic tunnel junction from at least one of the first and second states to the other of the first and second states.

In some embodiments of the current invention, the second ferromagnetic layer is constructed to have a coercivity that increases with a change in the voltage applied between the first and second electrodes (102, 104) while the first ferromagnetic layer has a coercivity that decreases with the change in the voltage applied between the first and second electrodes (120, 104). For example, in a particular embodiment, as an applied voltage changes from zero to a positive voltage the coercivity of the second ferromagnetic layer 112 (top) increases while the coercivity of the first ferromagnetic layer 108 (bottom) decreases. This is just one example to help explain some embodiments and is not intended to limit the broad scope of the invention.

In some embodiments, magneto-electronic device 100 can include a sub-structure 114, which can include a substrate 116 and other components. For example, the substructure can include a source of a bias magnetic field 118 according to some embodiments of the current invention. In some embodiments, the electric-field-controllable magnetic tunnel junction 106 is arranged in the bias magnetic field such that the second anisotropy of the second ferromagnetic layer has parallel and antiparallel orientations relative to the bias magnetic field. In this embodiment, the voltage applied between the first and second electrodes (102, 104) causes a change in a coercivity of the second ferromagnetic layer 112 to assist the bias magnetic field to change the second anisotropy of the second ferromagnetic layer 112 from the antiparallel to the parallel orientation relative to the bias magnetic field while the first magnetic anisotropy of the first ferromagnetic layer 108 remains unchanged in orientation.

In some embodiments, the source of the bias magnetic field 118 provides a substantially constant magnetic field. For example, the source of the bias magnetic field 118 can be a permanent magnet, such as a layer of magnetic material. In other embodiments, the source of the bias magnetic field 118 can provide a changeable magnetic field. For example, the source of the bias magnetic field 118 can be, or include, an electromagnet in some embodiments. Although FIG. 1 provides one example for an arrangement of the source of the bias magnetic field 118, the general concepts of the current invention are not limited to this particular example.

In some embodiments, the first and second magnetic anisotropies of the first and second ferromagnetic layers 108, 112) can be substantially perpendicular to the first and second ferromagnetic layers (108, 112), i.e., a p-MTJ.

The term "insulating layer", as used herein, is intended to refer to an electrical insulator. The insulating layer 110 provides a tunneling potentially energy barrier in which electrons pass through by quantum mechanical tunneling to provide a tunneling current. The structure and composition of the tunneling barrier has a large effect of the probability of electron tunneling through the barrier. In some embodiments, the insulating layer 110 can be a MgO layer. For example, the insulating layer 110 may consist essentially of MgO. In other embodiments, the insulating layer 110 can consist essentially of MgO, AlO, $HfO_2$, $Ta_2O_5$, or ZrO, or any combination thereof.

$Co_{40}Fe_{40}B_{20}$ has been found to be a suitable material for the ferromagnetic layers 108 and 112. Although this ferromagnetic material has been found to work well for particular embodiments, the general concepts of the current invention are not limited to only the use of $Co_{40}Fe_{40}B_{20}$.

In some embodiments, the first ferromagnetic layer 108 has a thickness of at least 0.7 nm and less than 1.2 nm, and the second ferromagnetic layer 112 has a thickness of at least 1.6 nm and less than 1.7 nm. In some embodiments, the first ferromagnetic layer 108 has a thickness of at least 1.0 nm and less than 1.5 nm, and the second ferromagnetic layer has a thickness of at least 1.5 nm and less than 1.8 nm. In some embodiments, the MgO insulating layer has a thickness of at least 1.0 nm and less than 2.0 nm. In some embodiments, the MgO insulating layer has a thickness of about 1.4 nm. The term "about" as used in this case means that the thickness is less than 1.5 nm, but more than 1.3 nm. However, in some embodiments, it can be closer to 1.4 nm.

In some embodiments, magneto-electronic device 100 can include a plurality of electric-field-controllable magnetic tunnel junctions arranged between respective pairs of electrodes (only one illustrated in FIG. 1) such that the magneto-electronic device 100 is a non-volatile data storage device. For example, the magneto-electronic device 100 can be a write-once data storage device in some embodiments, or can be a rewritable data storage device in other embodiments. As will be described in more detail for some particular embodiments below, the magneto-electronic device 100 can rely on either constant or re-orientable bias magnetic fields in combination with applied voltages to write and/or erase data when the magneto-electronic device 100 is a data storage device. In addition, an applied current in combination with applied voltages can also be used to write and/or erase data in data storage devices according to some embodiments of the current invention. However, the magneto-electronic device 100 is not limited to only data storage devices.

A method of producing a magneto-electronic device according to some embodiments of the current invention includes forming a first electrode on a substrate, forming a first ferromagnetic layer on the first electrode, forming an insulating layer on the first ferromagnetic layer, forming a second ferromagnetic layer on the insulating layer, and forming a second electrode on the second ferromagnetic layer. The insulating layer is formed as a layer of MgO that has a thickness of at least 1.0 nm and less than 2.0 nm. The first ferromagnetic layer is formed as a layer of $Co_{40}Fe_{40}B_{20}$ that has a thickness of at least 1.0 nm and less than 1.5 nm. The second ferromagnetic layer is formed as a layer of $Co_{40}Fe_{40}B_{20}$ that has a thickness of at least 1.5 nm and less than 1.8 nm. In some embodiments, the first ferromagnetic layer is a layer of $Co_{40}Fe_{40}B_{20}$ that has a thickness of at least 0.7 nm and less than 1.2 nm, and the second ferromagnetic layer is a layer of $Co_{40}Fe_{40}B_{20}$ that has a thickness of at least 1.6 nm and less than 1.7 nm. In some embodiments, the insulating layer is a layer of MgO that has a thickness of about 1.4 nm.

EXAMPLES

The following examples help explain some concepts of the current invention. The broad concepts of the current invention are not limited to only these particular examples, which are provided for explanation.

The MTJs based on MgO tunnel barrier are the devices of choice for read heads, MRAM and logic elements. Usually, the MTJs have relatively thick FM layers (>3 nm) with in-plane [1-4,29], or perpendicular magnetic anisotropy[30-32]. But in both situations the magnetic anisotropy is not related to the FM/oxide interfaces. The effect of an electric field in these MTJs therefore is, at best, negligible because the electric field can only penetrate into the metallic FM electrodes by a few monolayers due to screening by the free electrons. Here we demonstrate the electric field effect in p-MTJs with very thin (1-1.6 nm) CoFeB electrodes where the perpendicular magnetic anisotropy (PMA) originates solely from the CoFeB/MgO interfaces (ref. 5). The applied electric field therefore can dramatically alter the interfacial magnetic anisotropy in these junctions such that voltage induced resistance switching can be achieved.

Figure 2A:
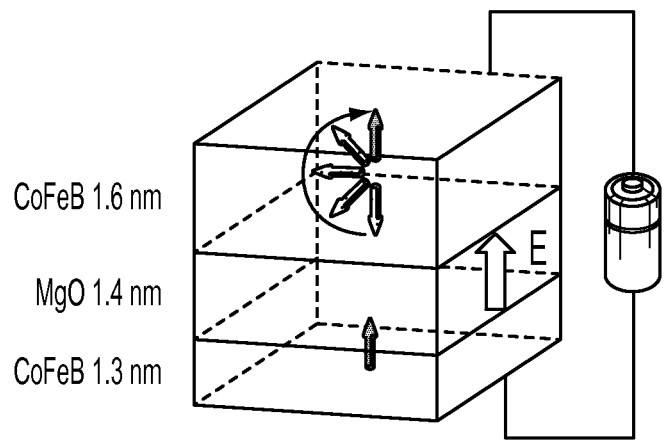
FIGS. 2A-2C provide an example of an electric-field assisted switching in a CoFeB/MgO/CoFeB MTJ with interfacial perpendicular magnetic anisotropy according to an embodiment of the current invention.

The structure of the MTJs is $Si/SiO_2/Ta(7\ nm)/Ru(15\ nm)/Ta(7\ nm)/Co_{40}Fe_{40}B_{20}(1.2\text{-}1.3\ nm)/MgO(1.2\text{-}2\ nm)/Co_{40}Fe_{40}B_{20}(1.6\ nm)/Ta(10\ nm)/Ru(24\ nm)$, where the most essential part is CoFeB/MgO/CoFeB with a schematic shown in FIG. 2A. The films were deposited in a multi-source UHV magnetron sputtering system with the base vacuum of $3\times10^{-9}$ Torr. After the deposition of the multilayers, MTJs in circular shapes with radius (r) ranging from 200 nm to 25 µm were fabricated and measured by 4-probe method on a probe station at room temperature (see below). The positive bias voltage corresponds to tunneling of electrons from the bottom CoFeB electrode to the top CoFeB electrode. The highest TMR ratio reached is 118%, close to the maximal reported TMR of 124% in this system[5].

Figure 2B:
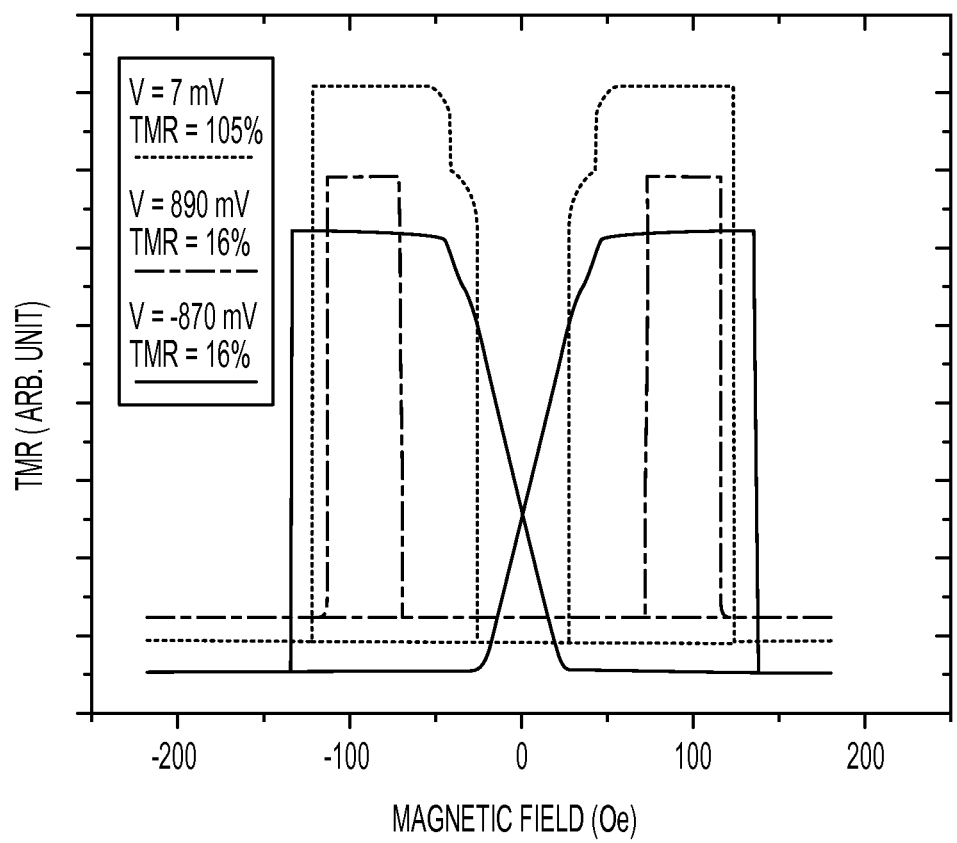
Figure 2C:
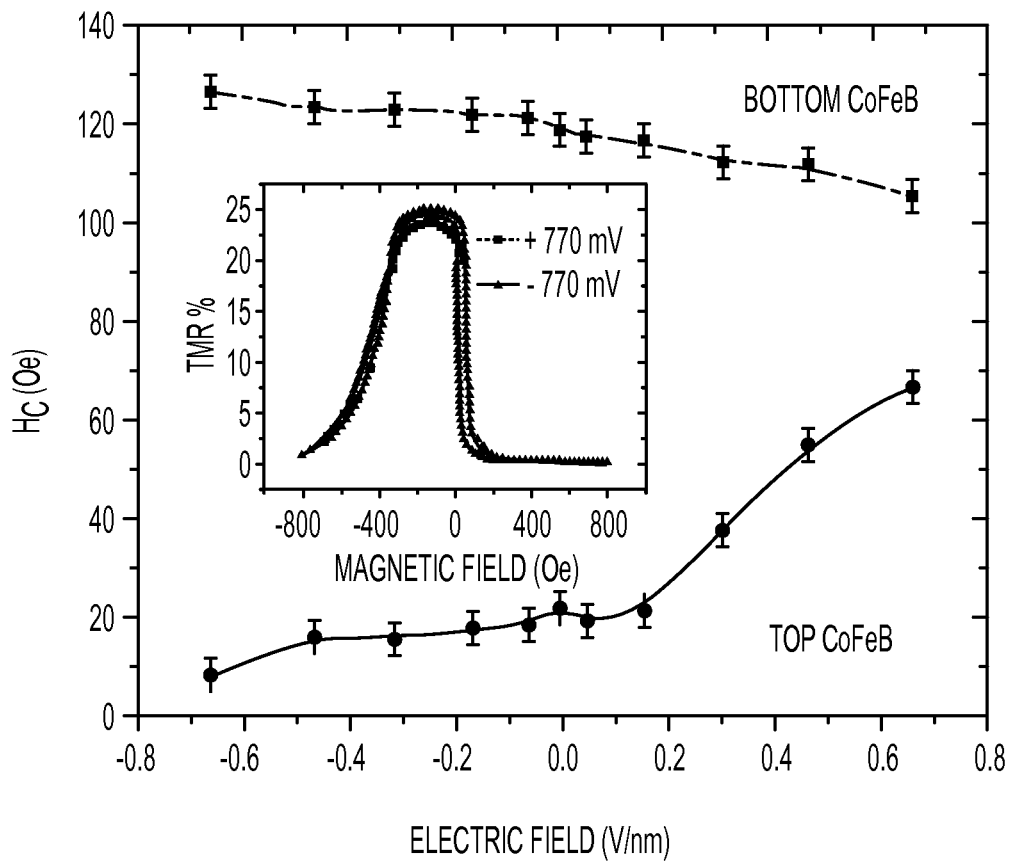

The striking effect of the electric field via a bias voltage $V_{bias}$ on magnetic anisotropy in these p-MTJs is presented in FIG. 2B. The key structure is CoFeB(1.3 nm)/MgO(1.4 nm)/CoFeB(1.6 nm) with size r=3.5 µm. The low and high resistance states are those with parallel (P) and antiparallel (AP) magnetizations with the switching fields at the coercivities of the two FM electrodes. The bottom electrode switches at a higher magnetic field and more sharply than the top electrode, identified through a thickness dependence study (see below). Under near zero bias voltage of $V_{bias}$=7 mV, the top and bottom CoFeB electrodes switch at 25 Oe and 120 Oe, respectively. The bias dependence of the TMR shows a normal behavior (see below). However, the switching fields become very different once a large bias voltage is applied. They become 72 Oe/115 Oe at $V_{bias}$=890 mV, and 20 Oe/137 Oe at $V_{bias}$=−870 mV as shown in FIG. 2B. Thus, the switching characteristics of the MTJ depend explicitly on the bias voltage $V_{bias}$, its value as well as its sign. Since the observed phenomenon is parity-odd with respect to the applied voltage, the possibility of heating effects can be ruled out. For comparison, we have also fabricated MTJs with in-plane anisotropy using the usual 3 nm CoFeB on both sides of the MgO barrier. The in-plane MTJs exhibit zero-bias TMR ratio between 200-350% but with no discernable difference between ±$V_{bias}$, as shown in the insert of FIG. 2C, where the switching field at 770 mV and −770 mV are virtually the same as one would expect. This demonstrates that the strong electric field effect only exists in MTJs with interfacial magnetic anisotropy. It may be noted that in the previous studies using single FM layers[24,26], a large voltage of 200 V was needed to observe appreciable electric field effects. In FeCo/MgO/Fe junctions, the modification of magnetic anisotropy could only be indirectly probed by STT induced ferromagnetic resonance measurement[27]. Here, due to the unique combination of interfacial perpendicular anisotropy and spin-dependent tunneling at the CoFeB/MgO interfaces, the effect of electric field can be directly studied by DC resistance, with a small voltage of a fraction of a volt.

The dependence of $H_C$ on the electric field $E_{bias}$, which is $V_{bias}$ divided by the barrier thickness, is shown in FIG. 2C. The error bars designate the standard deviation of $H_C$ in a few measurements. For the bottom electrode, $H_C$ depends quasi linearly with $E_{bias}$, decreasing smoothly with increasing $E_{bias}$, from negative to positive values of $E_{bias}$. The top electrode exhibits the opposite dependence where $H_C$ increases with increasing $E_{bias}$. For the negative $E_{bias}$, $H_C$ levels off and approaches zero at about $E_{bias}$≈−0.7 V/nm, at which point the magnetic easy axis is on the verge of changing from perpendicular to in-plane, leading to a small slope compared to the positive $E_{bias}$ branch. This effect is the direct consequence of the modification of magnetic anisotropy by the electric field. The increased (decreased) coercivity of the top CoFeB layer at positive (negative) $V_{bias}$ is consistent with the notion that depleting (accumulating) electrons in the ferromagents enhances (decreases) PMA as found previously in single layer experiments.[26,28] This change of anisotropy was led by a change of the electron density between different d states of the magnetic layers under an electric field according to theoretical studies[6,7,33]. An important consequence is that the reverse effect also exists for the bottom CoFeB layer due to the opposite sign of the electric field. As a result, $H_C$ of the top and bottom CoFeB have opposite dependences on $E_{bias}$.

Figure 3:
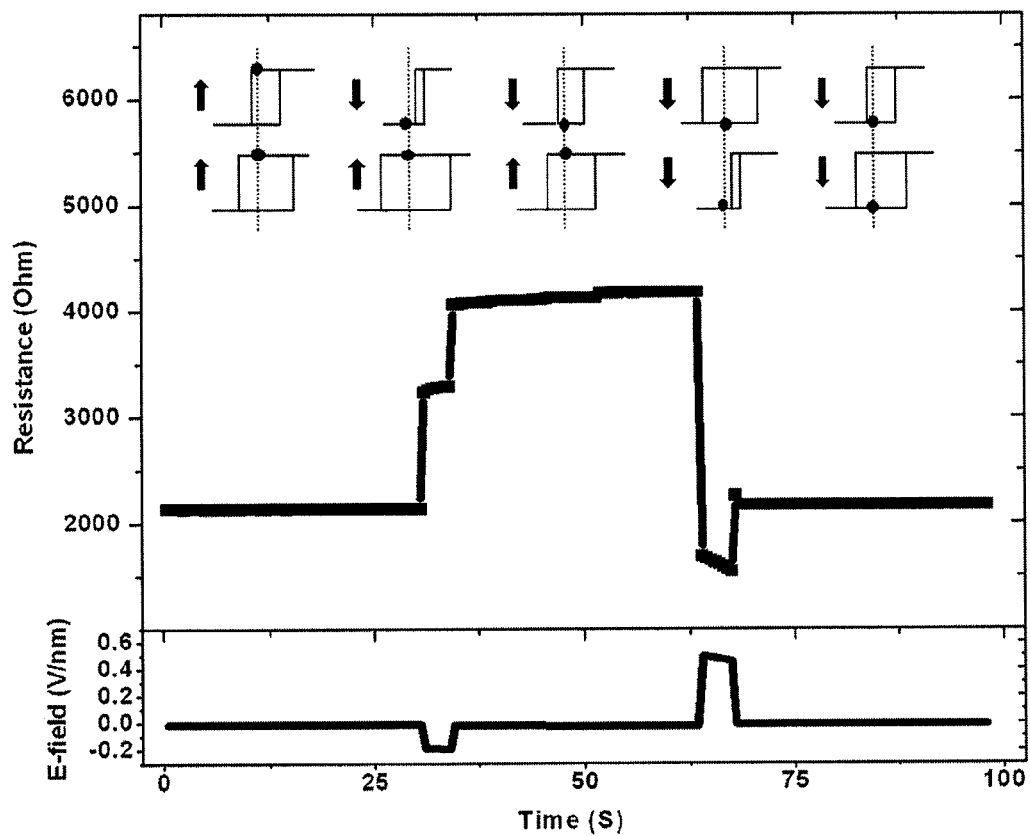
FIG. 3 shows an example of manipulation of giant tunneling resistance by an electric field according to an embodiment of the current invention. The upper panel shows response of the resistance to the applied electric field in the lower panel. The schematic magnetic configuration of the top and bottom CoFeB layers is also shown. The arrow represents the magnetization direction. The dotted line represents the applied external magnetic field that shifts the center of the hysteresis loops. The dot represents position of the magnetization on the hysteresis loop.

Due to the interfacial nature of both perpendicular anisotropy and spin-dependent tunneling in the present system, one can directly control the tunneling conductance of the MTJ by an electric field. This effect can be readily demonstrated in MTJs with $H_C$ of two FM layers to be closer in values than those displayed in FIG. 2C. As shown in FIG. 3, we first set the two CoFeB electrodes with parallel moments (P) in the up direction with a junction resistance of about 2100 Ω. A constant biasing magnetic field $H_{bias}$=−15 Oe was applied to keep the MTJ in parallel configuration and shift the magnetization state from the origin as shown schematically in FIG. 3. A voltage pulse of −400 mV (corresponding to an electric field of −0.24 V/nm) was then applied to the MTJ. Due to the decreased $H_C$, the magnetization of the top layer is reversed by this −400 mV pulse since now the only possible magnetic state is pointing down under $H_{bias}$. The bottom CoFeB electrode is left intact due to its larger, and in fact increased, $H_C$. This is evidenced by the larger junction resistance of about 4200 Ω in the antiparallel (AP) state as a result of the −400 mV pulse, and remains so after the −400 mV pulse was removed. Subsequently, the magnetization of the bottom CoFeB layer was switched by a positive voltage pulse of +800 mV (corresponding to an electric field of 0.48 V/nm), which reduces its $H_C$ and the MTJ returned to the low resistant state. These results clearly show that the MTJ has been changed from the low to the high resistance state by a negative voltage pulse and reversibly switched back to the low resistance state again by a positive voltage pulse. Further reversible switching is possible if the direction of biasing magnetic field is changed, for example through the electric field controlled exchange bias[14], especially when considering the small magnitude of such an effect is not enough to switch the magnetization of a perpendicular film but should be sufficient for our purpose as a biasing field. One notes from FIG. 3 that during the presence of the bias voltage pulses, although the CoFeB layer has already been reversed, the resistance is less than the full value at the zero-bias state. This is due to the increased tunneling probability, thus reduced resistance, in the presence of a substantial voltage. The maximum DC current density involved in this voltage-controlled switching process is only $1.2 \times 10^2$ A/cm$^2$ for this large junction with r=10 μm, indicating it is entirely due to the electric field effect instead of STT which normally only occurs at a much higher current density ~$10^6$ A/cm$^2$.[11]

The change of perpendicular anisotropy energy is estimated to be 50 μJ/m$^2$ per V/nm for the bottom CoFeB electrode (see supplementary). Previously a change of 33 μJ/m$^2$ per V/nm was found in the single CoFeB layer as studied by the Hall effect[28]. Theoretically, an anisotropy energy change of about 20 μJ/m$^2$ per V/nm has been found for the Fe/vacuum interface[6] and 100 μJ/m$^2$ per V/nm for the Fe/MgO interface[33]. The large value in the later case was ascribed to the higher dielectric constants of MgO ($\epsilon_r$~9). Although the sign of this effect in the present study agrees with previous experiments on CoFe/MgO and CoFeB/MgO[27,28], theoretical calculations do produce different signs for Fe/vacuum and Fe/MgO systems[6,33]. Therefore, a calculation can be done on the exact CoFeB/MgO system to compare with the experimental results.

Figures 4A, 4B, 4C:
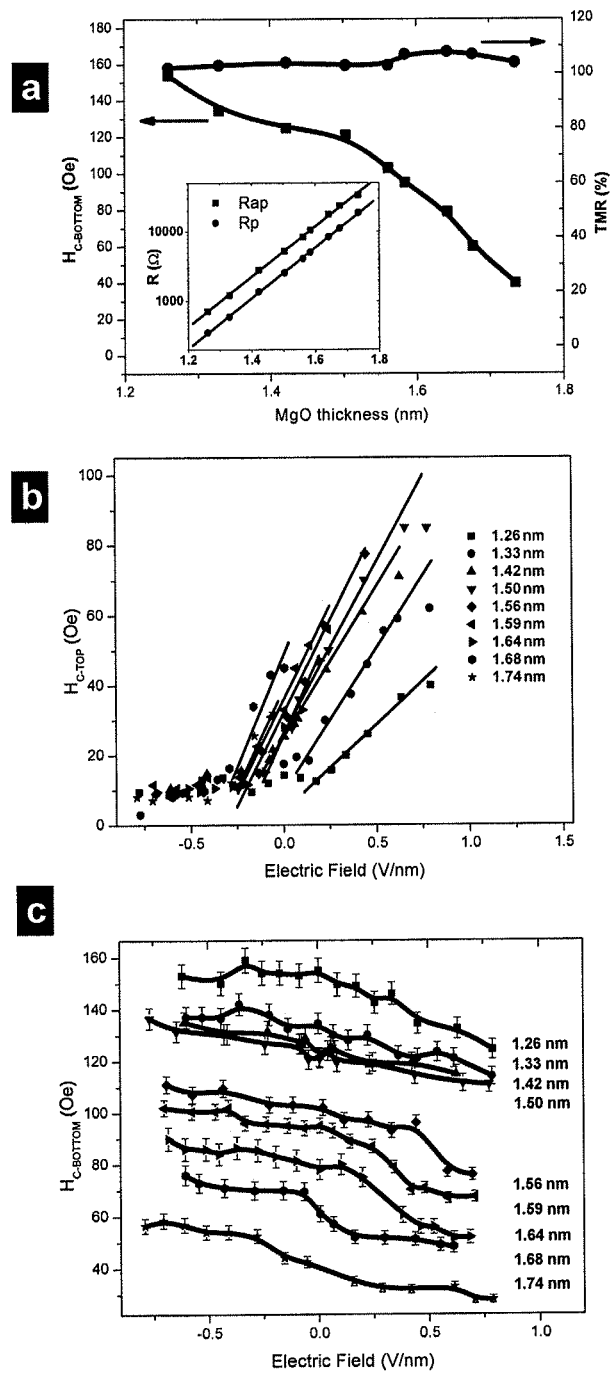
FIGS. 4A-4C provide data that illustrate effects of electric field in MTJs with different perpendicular anisotropy energy.

It is known that PMA depends inversely on the CoFeB thickness (ref 5 and below). However, due to the finite penetration depth of the electric field in the CoFeB, it is not straightforward to separate contributions due to electric field and thickness. Therefore, it is essential to maintain a constant CoFeB thickness while altering the PMA if one wants to investigate the effect of electric field at different PMA strength. We found that this can be accomplished in MTJs with different MgO barrier thickness. The radius of these MTJs is 3.5 μm. As shown in FIG. 4A, the easy-axis $H_C$ of the bottom CoFeB layer increases from 40 Oe to 150 Oe when MgO thickness has been reduced from 1.8 nm to 1.2 nm, while maintaining TMR very close to 100%. The WKB fitting shown in the inset of FIG. 4A yields a decay rate constant of 8.3 nm$^{-1}$, very close to 8.6 nm$^{-1}$ obtained previously from in-plane junctions fabricated under similar condition[34], indicating that all the MgO tunnel barriers at different thickness behave normally in these p-MTJs. The nearly constant TMR is a reflection that the TMR reduction due to the slight over-oxidation at a thicker MgO barrier is compensated by the natural increase of TMR with MgO thickness[4,35]. On the other hand, the PMA depends sensitively on the oxidation states because it is originated from the hybridization of the 3d orbitals of transition metals and the 2p orbitals of oxygen from MgO[36,37].

The electric field dependence of $H_C$ in the top and bottom CoFeB are shown in FIG. 4B and FIG. 4C, respectively, in CoFeB(1.3 nm)/MgO (t)/CoFeB(1.6 nm) junctions with varying MgO thickness. For the top CoFeB layer shown in FIG. 4B, $H_C$ displays a very similar behavior as in FIG. 2C; with a quasi linear increasing $H_C$ at positive $E_{bias}$ and slowly approaching zero at negative $E_{bias}$. The slope of the positive field branch increases from 50 nm·Oe/V at 1.25 nm MgO to a maximum of about 150 nm·Oe/V at 1.7 nm MgO. For the MTJ with 1.5 nm MgO barrier, $H_C$ was modulated from 20 Oe to 85 Oe, a more than 4 fold change under the positive electric field of 0.6 V/nm. This is very appealing for voltage-tunable applications. For the bottom CoFeB electrode, a linear dependence is approximately held under negative electric field for all the MTJs with different anisotropy strength. The slope of the negative branches is about −20 nm·Oe/V. However, more complicated behavior is found for the positive field branches. For those junctions with MgO barrier thickness larger than 1.5 nm, a steeper slope is apparent under the positive field. First principle studies did predict an asymmetric dependence of anisotropy energy under positive and negative electric field at the Fe/MgO interface[36].

Figures 5A, 5B, 5C:
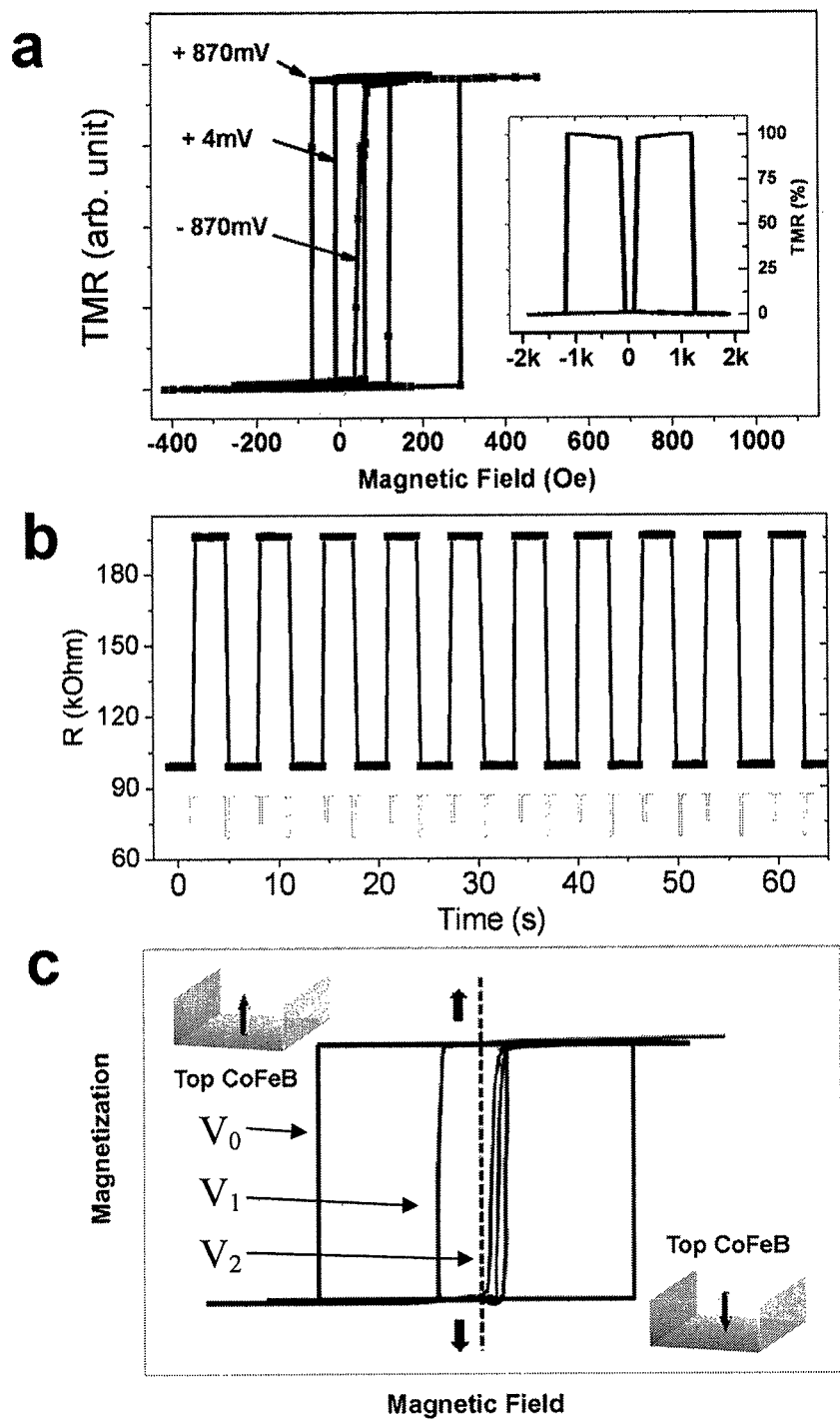
FIGS. 5A-5C show an example of electric field induced unipolar switching according to an embodiment of the current invention.

As described earlier, further reversible switching of the resistance states in FIG. 3 will require changing the direction of $H_{bias}$. Here we show a special unipolar switching process to reversibly control the resistance states under a constant $H_{bias}$. The STT effect occurring in MTJs with submicron sizes is greatly facilitated by the reduced PMA at negative voltages, which can be used to complement the electric field to achieve reversible switching. This effect is demonstrated in a junction with r=200 nm and a zero bias TMR of 100%. The minor loops of the TMR curve are shown in FIG. 5A, with the zero-voltage full TMR curve shown in the inset. The $H_C$ of the top CoFeB again shows dramatic change under different bias voltages. The $H_C$ is 70 Oe at near zero bias. It increases almost 2.5 times to 172 Oe at $V_{bias}$=+870 mV and reduces to 8 Oe at $V_{bias}$=−870 mV. This MTJ can be reversibly switched by consecutive negative pulses as shown in FIG. 5B. The magnetization of the bottom CoFeB layer was kept pointing down and a constant $H_{bias}$ of 55 Oe was applied during the entire process. A series of 200 ms pulses with alternating amplitude of $V_1$ (−0.9V) and $V_2$ (−1.5V) were sent to the MTJ every 3 seconds. After each switching pulse the resistance is monitored at 10 mV. We can clearly see that the MTJ is consistently switched by these unipolar pulses, as opposite to the bipolar pulses used in usual STT effect. The likely explanation of this unipolar switching process is schematically shown in FIG. 5C. The zero bias hysteresis loop of the top CoFeB is in blue color with a large $H_C$ (the magnetization of the bottom CoFeB layer is kept pointing down). $H_{bias}$ is represented by the vertical dotted line. The initial state of the magnetization of top CoFeB layer is pointing down. When a negative voltage $V_1$ is applied, the hysteresis loop dramatically reduces its width. due to the electric field. Simultaneously, the STT switching occurs at the current density of $-1.2 \times 10^4$ A/cm$^2$ (−15 μA), thanks to the greatly reduced energy barrier and the applied $H_{bias}$ favoring AP state, which is much smaller than the normal STT switching current density at ~$10^6$ A/cm$^2$. Therefore the magnetization is very efficiently brought to the up direction by $V_1$ and stays pointing up after $V_1$ is removed. The switching back is achieved by applying a more negative voltage $V_2$. Now the loop becomes the one in black color because $|V_2|>|V_1|$. Under $H_{bias}$, the only stable state is pointing down. The magnetization of top CoFeB is switched back by $V_2$ and stays so when $V_2$ is removed, as for V=0 (blue curve) both up and down are stable states. For the MTJ shown in FIG. 5B, the current corresponding to $V_2$ is −45 μA, therefore the average switching current density is only $-2.4 \times 10^4$ A/cm$^2$, clearly demonstrating its merit as a very energy efficient switching process. Similar results were also obtained in 5 other MTJs on the same wafer.

Note the switching results in complete AP or P state, instead of intermediate states as previously observed in full metallic spin valves[38]. The activation energy is determined to be 42 $k_B T$ by the change of $H_C$ under different magnetic field ramp rates, indicating the magnetization reversal is through the incoherent mode, as suggested in previous studies[5,39]. Heating is always a concern during the STT switching. However, the fact that the $H_C$ at +870 mV is more than 20 times larger than the $H_C$ at −870 mV suggests that this greatly reduced switching current is primarily due to the effect of electric field. As expected, the usual spin torque switching by positive pulses can never change the resistance state for the case here due to the enhanced energy barrier under positive electric field. Indeed, attempting switching from AP to P state with positive pulses leads to the breakdown of the MTJ at about +2V. Also note that during the falling of the −1.5V pulse, there is a brief moment (hundreds of ns) when the MTJ experiences the voltage of about −0.9V. However, the top CoFeB will not be switched to the up state because a much large voltage under the ~100 ns scale would be required in the thermally activated switching region. Therefore, after the applications of $V_1$ and $V_2$ pulses, the MTJ retains one or the other stable state.

We have demonstrated in CoFeB/MgO/CoFeB p-MTJs that the electric field, both the magnitude and its direction, has a direct effect on the PMA of the CoFeB layers such that the magnetic configuration and tunneling magnetoresistance can be switched at much smaller current densities. It represents a crucial step towards voltage controlled spintronic devices such as ultra-low energy MRAM and logic elements. These results can also provide a framework for other non-spintronic applications where voltage and electric field can be brought to bear, for example in the novel electrostatically tunable, low-noise, low-energy microwave devices[20].

Sample Fabrication

The MTJs in the above examples were fabricated using a 10-source UHV magnetron sputtering system. The structure of the MTJs in this study is Si/SiO$_2$/Ta(7 nm)/Ru(15 nm)/Ta (7nm) /Co$_{40}$Fe$_{40}$B$_{20}$(1.2-1.3 nm)/MgO(1.2-2 nm)/ Co$_{40}$Fe$_{40}$B$_{20}$(1.6 nm)/Ta(10 nm)/Ru(24 nm). The base pressure of the sputtering chamber is $3 \times 10^{-9}$ Torr. All the metal layers were deposited by DC sputtering under a pressure of 2 mTorr. The MgO layer was deposited by RF sputtering under a pressure of 1 mTorr. The deposition rate of MgO layer is about 0.25 Å/s. One of the critical conditions in achieving good perpendicular MTJs is to maintain an ultra-clean CoFeB/MgO interface, since the perpendicular anisotropy is originating from this interface as demonstrated in anomalous Hall effect described later in this supplementary information. Therefore, the H$_2$ and H$_2$O partial pressure in the chamber was closely monitored by a residue gas analyzer. The H$_2$O partial pressure was substantially reduced by pre-sputtering Ta prior to the MgO layer disposition (Nagamine, Y. et al. Ultralow resistance-area product of 0.4 Omega(mu m)[sup 2] and high magnetoresistance above 50% in CoFeB/MgO/ CoFeB magnetic tunnel junctions. *Applied Physics Letters* 89, 162507-3 (2006); Choi, Y. S. et al. Effect of Ta getter on the quality of MgO tunnel barrier in the polycrystalline CoFeB/MgO/CoFeB magnetic tunnel junction. *Applied Physics Letters* 90, 012505-3 (2007)). Circular MTJs with radius ranging from 200 nm to 25 μm were fabricated after the disposition of multilayers. The fully patterned MTJs were then annealed for 5-30 min in a rapid thermal annealing system in Ar atmosphere under the perpendicular field of 3 kOe (Wang, W. G. et al. Understanding tunneling magnetoresistance during thermal annealing in MgO-based junctions with CoFeB electrodes. *Physical Review B* 81, 144406 (2010); Wang, W. G. et al. Real-time evolution of tunneling magnetoresistance during annealing in CoFeB/MgO/CoFeB magnetic tunnel junctions. *Applied Physics Letters* 92, 152501 (2008)). We found both TMR and PMA has a strong dependence on annealing time. Detailed study on this aspect will be published elsewhere.

Figure 6:
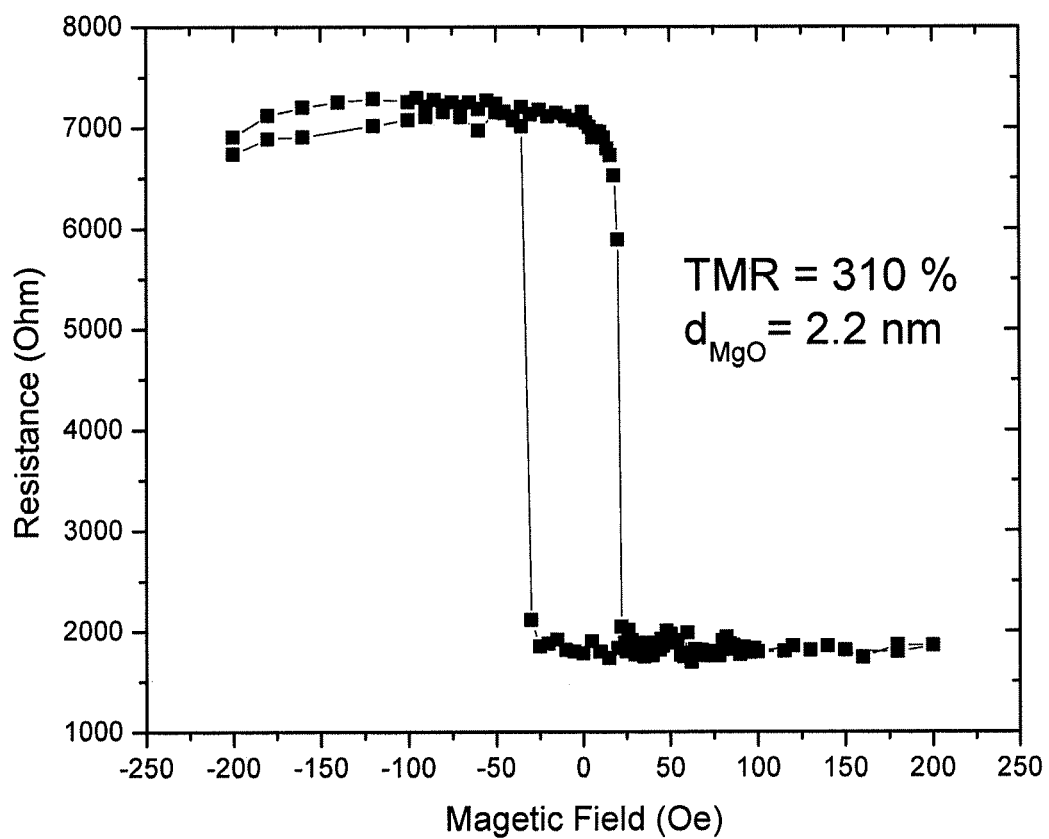
FIG. 6 shows a representative TMR curve of the MTJs with thicker CoFeB electrodes (3 nm)
Figure 7:
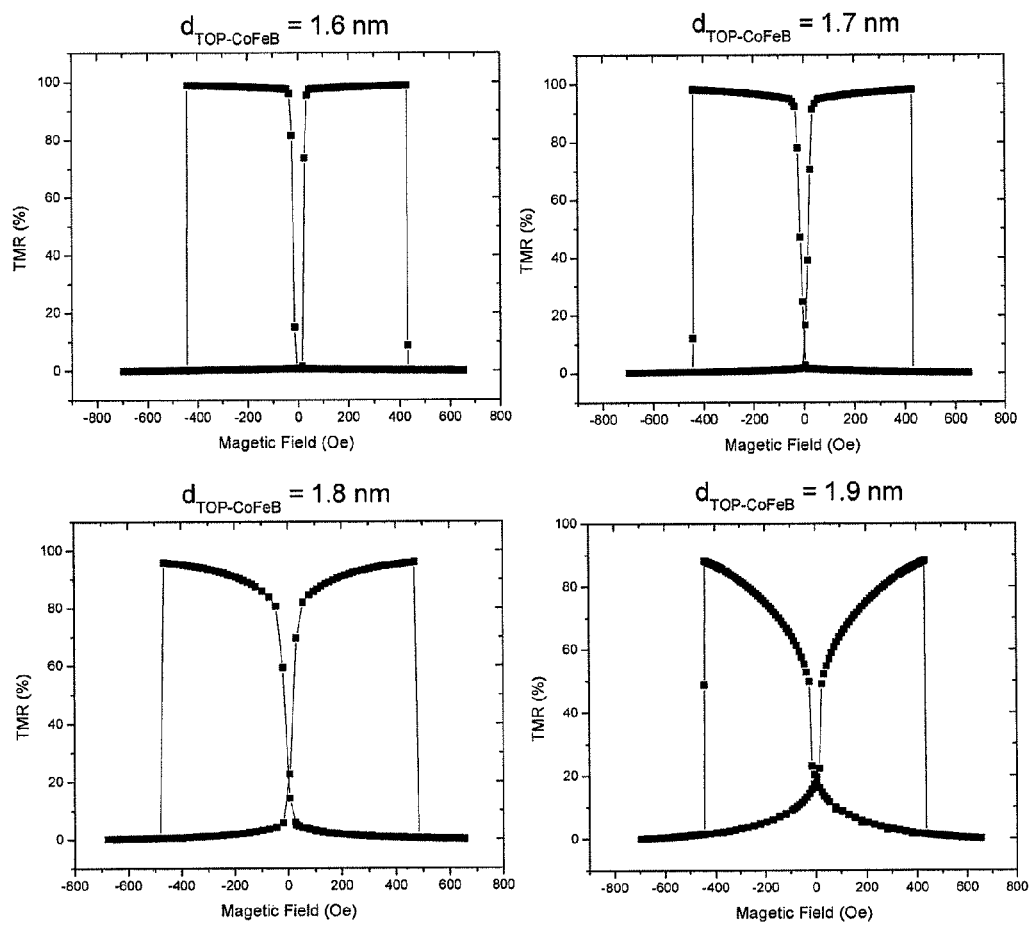
FIG. 7 shows TMR curves of the junctions with different top CoFeB layers.

For comparison, MTJs with in-plane magnetic anisotropy were also fabricated, the structure is Si/SiO$_2$/Ta(7 nm)/Ru(15 nm)/Ta(7 nm)/CoFe(2 nm)/IrMn(15 nm)/CoFe(2 nm)/Ru(0.8 nm)/CoFeB(3 nm/MgO(1-2.5 nm) /CoFeB(3 nm)/Ta(8 nm)/Ru(24 nm). These junctions generally show larger TMR (200-350%) compared to the MTJs with perpendicular anisotropy. A representative TMR curve in these MTJ with thicker CoFeB layers is shown in FIG. 6.

Top CoFeB Layer Thickness Dependence Study

In order to indentify the switching field for the two CoFeB layers, we have fabricated MTJs with the top CoFeB electrode in different thickness. The sample structure is Si/SiO$_2$/Ta(7 nm)/Ru(15 nm)/Ta(7 nm)/Co$_{40}$Fe$_{40}$B$_{20}$(1.2 nm)/MgO (1.5 nm)/Co$_{40}$Fe$_{40}$B$_{20}$(1.5-2 nm)/Ta(10 nm)/Ru(24 nm). The threshold for the perpendicular magnetic anisotropy for the top CoFeB layer is about 1.8 nm. In all the samples we can see the switching of the hard layer occurs at approximately 450 Oe. On the other hand, the switching of the soft layer shows obvious difference. Since the only difference in these samples is the thickness of top CoFeB electrode, we can identify the bottom CoFeB as the hard layer with the larger switching field and the top CoFeB layer as the soft layer with smaller switching field. The evolution of the switching field for the top electrode is due the change from perpendicular to in plane magnetic anisotropy when the thickness of top CoFeB increases.

Origin of the Perpendicular Anisotropy in the Ta/CoFeB/MgO/CoFeB/Ta MTJs

Figure 8:
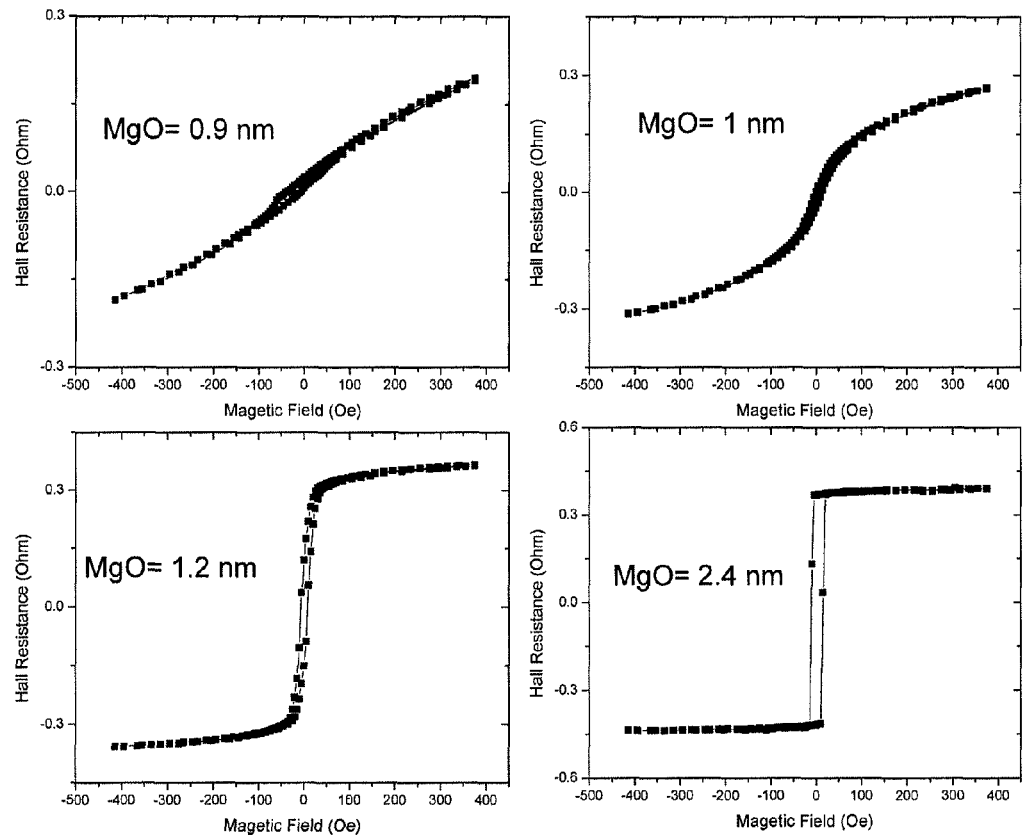
FIG. 8 shows AHE of Ta/CoFeB/MgO with different MgO thickness.

In order to confirm the observed perpendicular anisotropy comes from the CoFeB/MgO interface instead of Ta/CoFeB interface. We have carried out the anomalous Hall effect (AHE) study. The sample structure is Si/SiO$_2$/Ta(7 nm)/Co$_{40}$Fe$_{40}$B$_{20}$(1.2 nm)/MgO(0.5-2.5 nm). The size of the Hall bar is 500×50 μm. These Hall bars were tested on probe station under perpendicular magnetic field. As we can clearly see from FIG. 8, there is a dramatic difference in the AHE curves with different MgO thickness. A square hysteresis loop is only developed when MgO is more than 1 nm thick. This is a clear indication that the perpendicular magnetic anisotropy of the Ta/CoFeB/MgO is originating from the CoFeB/MgO interface, instead of the Ta/CoFeB interface.

Bias Dependence of TMR for the MTJs

Figure 9:
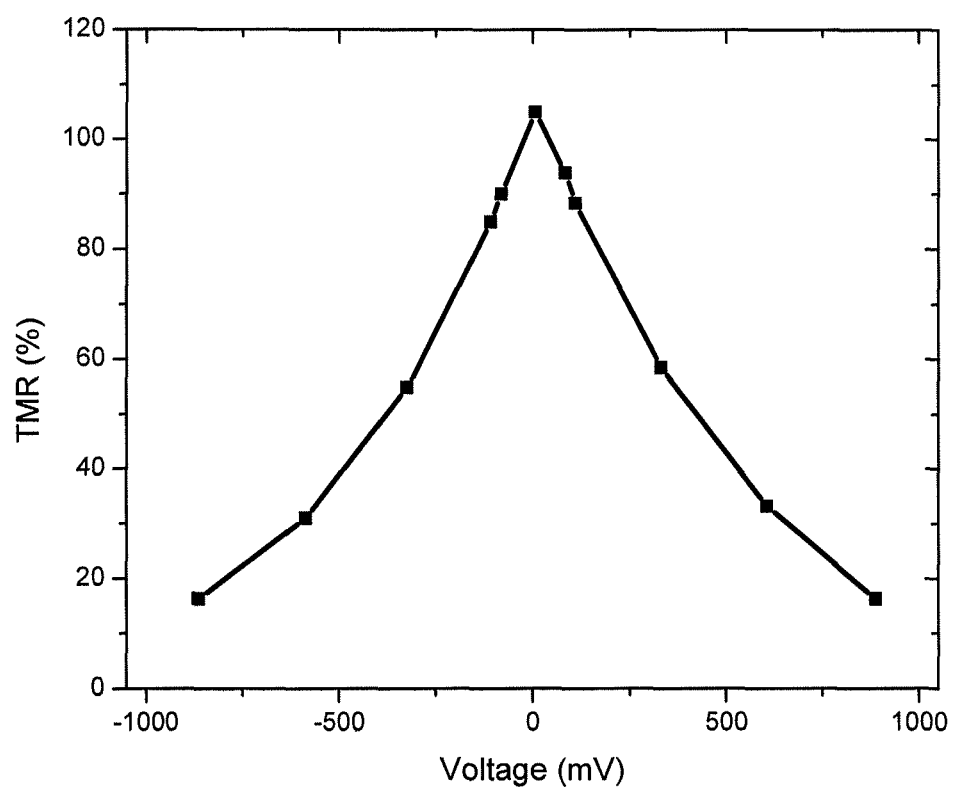
FIG. 9 shows bias dependence of TMR for the MTJ shown in FIG. 2B.

The bias dependence of TMR for the p-MTJ has the expected behavior of decreasing TMR with increasing V$_{bias}$, with a half voltage (at which TMR drops to half of its zero-bias value) about 370 mV as shown in FIG. 9. The bias dependence of TMR for the MTJ in FIG. 5 shows very similar behavior.

Calculation of Anisotropy Energy and the Relative Change under Electric Field

To quantify the change of magnetic anisotropy energy in these MTJs, we have carried out hard-axis magnetoresistance and magnetization measurement. For studying the properties of the bottom CoFeB layer, the magnetization of Ta(7 nm)/Ru(15 nm)/Ta(7 nm)/CoFeB(1.2 nm)/MgO(1.8 nm) was measured under an in-plane (hard axis) and an out-of-plane (easy axis) field by VSM. The sample has an easy axis coercivity H$_C$ of 10 Oe and a saturated magnetization M$_S$ of 1130 emu/cm$^3$ as shown in FIG. S5-b. The anisotropy field H$_A$ determined in the in-plane field is about 1700 Oe, giving a PMA energy density of E$_p$=−M$_S$H$_A$/2=9.8×10$^5$ erg/cm$^3$ for CoFeB(1.2 nm)/MgO(1.8 nm) layers. For studying the magnetic properties of the top electrode, samples with the structure of Ta(7 nm)/MgO(1.2 nm)/CoFeB(1.6 nm)/Ta (5 nm) were tested. The saturated magnetization was found to decrease to be about 500 emu/cm$^3$, possibly due to magnetic dead layer in this structure (Ikeda, S. et al. A perpendicular-anisotropy CoFeB-MgO magnetic tunnel junction. *Nature Materials* 9, 721-724 (2010)).

Figure 10A:
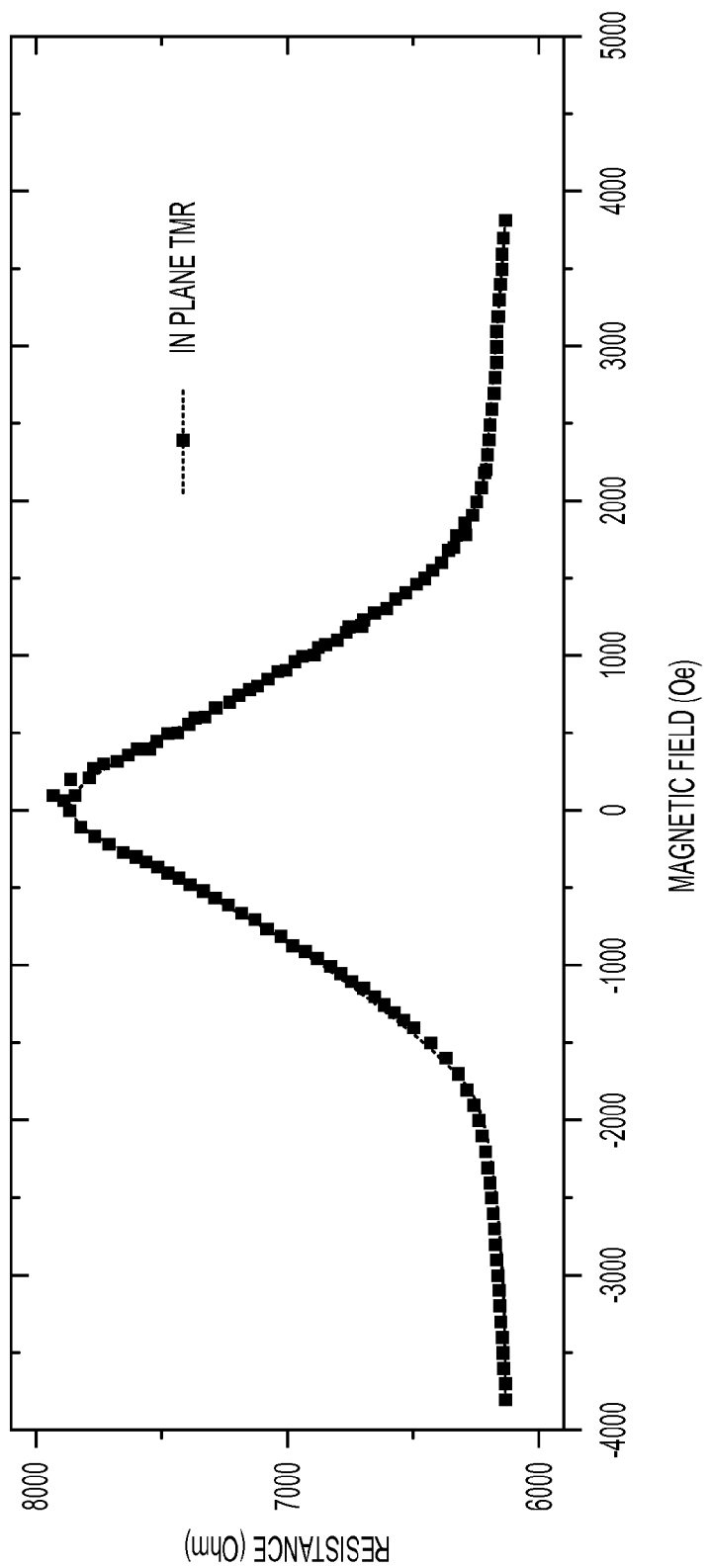
FIGS. 10A-10B show the determination of anisotropy energy change under electric field in CoFeB/MgO/CoFeB junctions according to an embodiment of the current invention.
Figure 10B:
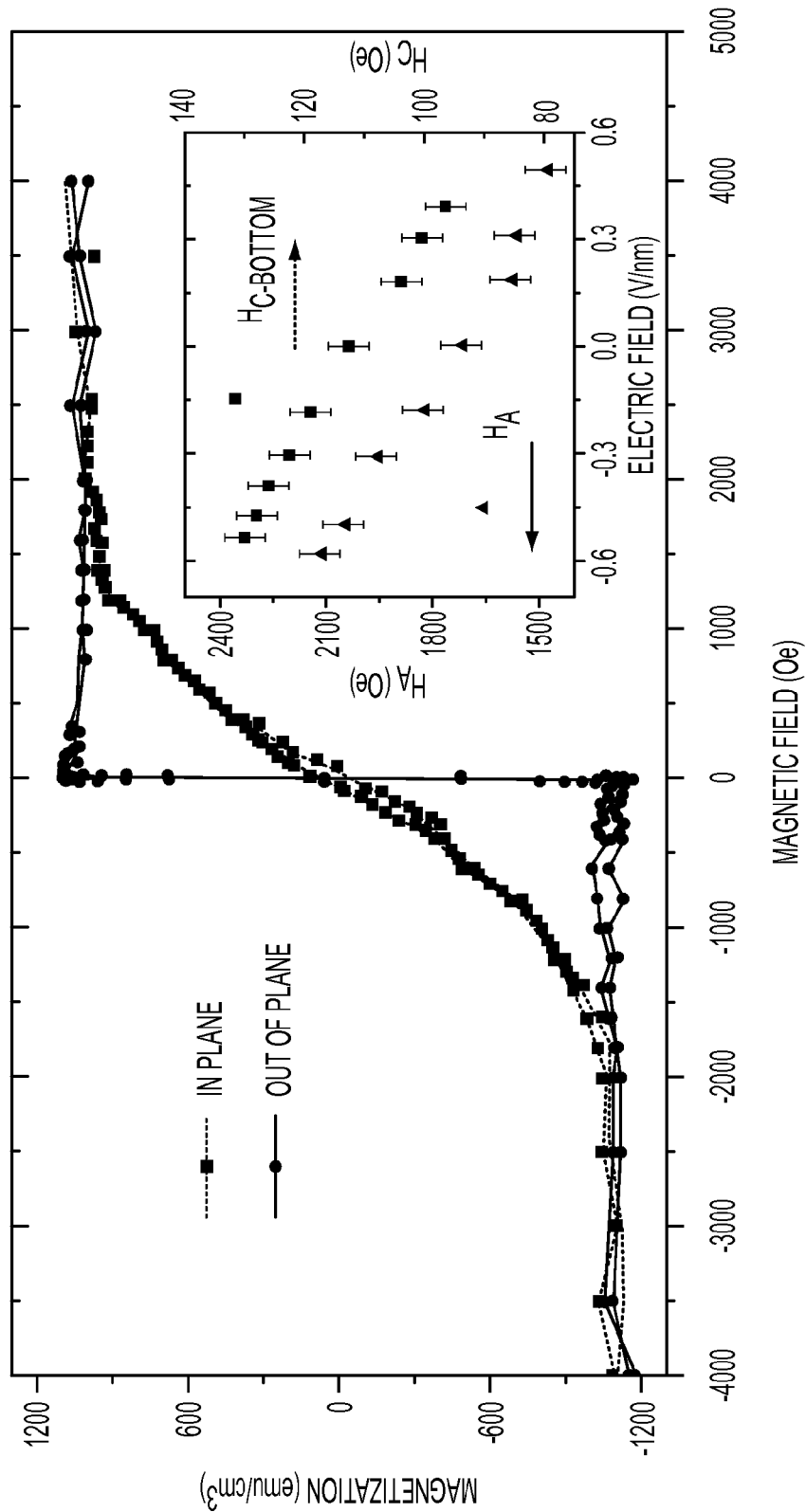

The hard-axis magnetoresistance measurement of the junction with CoFeB(1.2 nm)/MgO(1.8 nm)/CoFeB(1.6 nm) is shown in FIG. 10A. The magnetoresistance of this junction also saturates at 1700 Oe. This is easy to understand since the top CoFeB has a weaker PMA as shown in FIG. 2B, therefore the saturation field of the TMR curve under in plane field corresponds to the anisotropy field of the bottom CoFeB. This allows us to calculate the anisotropy energy of the bottom CoFeB layer under different electric field by using the hard-axis TMR measurement with an in-plane magnetic field. The anisotropy field of the bottom CoFeB varies quasi linearly with the electric field as shown in the inset of FIG. 4B. This linear dependence gives a change of perpendicular anisotropy energy of 50 μJ/m$^2$ per V/nm. One also notes that the easy-axis switching field has a very similar dependence on electric field as that of the anisotropy field determined by the hard-axis TMR measurement as shown in the inset of FIG. 10B, indicating that H$_C$ in the bottom CoFeB is a good measure of its anisotropy energy.

REFERENCES

1. Moodera, J. S., Kinder, L. R., Wong, T. M. & Meservey, R. Large Magnetoresistance at Room-Temperature in Ferromagnetic Thin-Film Tunnel-Junctions. *Physical Review Letters* 74, 3273-3276 (1995).
2. Miyazaki, T. & Tezuka, N. Giant magnetic tunneling effect in Fe/Al2O3/Fe junction. *Journal of Magnetism and Magnetic Materials* 139, L231-L234 (1995).
3. Parkin, S. S. P. et al. Giant tunnelling magnetoresistance at room temperature with MgO (100) tunnel barriers. *Nature Materials* 3, 862-867 (2004).
4. Yuasa, S., Nagahama, T., Fukushima, A., Suzuki, Y. & Ando, K. Giant room-temperature magnetoresistance in single-crystal Fe/MgO/Fe magnetic tunnel junctions. *Nature Materials* 3, 868-871 (2004).
5. Ikeda, S. et al. A perpendicular-anisotropy CoFeB-MgO magnetic tunnel junction. *Nature Materials* 9, 721-724 (2010).
6. Duan, C. -G. et al. Surface Magnetoelectric Effect in Ferromagnetic Metal Films. *Physical Review Letters* 101, 137201 (2008).
7. Nakamura, K. et al. Giant Modification of the Magnetocrystalline Anisotropy in Transition-Metal Monolayers by an External Electric Field. *Physical Review Letters* 102, 187201 (2009).
8. Tsujikawa, M. & Oda, T. Finite Electric Field Effects in the Large Perpendicular Magnetic Anisotropy Surface Pt/Fe/Pt(001): A First-Principles Study. *Physical Review Letters* 102, 247203 (2009).
9. Stohr, J., Siegmann, H. C., Kashuba, A. & Gamble, S. J. Magnetization switching without charge or spin currents. *Applied Physics Letters* 94, 072504-3 (2009).

10. Negulyaev, N. N., Stepanyuk, V. S., Hergert, W. & Kirschner, J. Electric Field as a Switching Tool for Magnetic States in Atomic-Scale Nanostructures. *Physical Review Letters* 106, 037202 (2011).
11. Sun, J. Z. & Ralph, D. C. Magnetoresistance and spin-transfer torque in magnetic tunnel junctions. *Journal of Magnetism and Magnetic Materials* 320, 1227-1237 (2008).
12. Bibes, M. & Barthelemy, A. Multiferroics: Towards a magnetoelectric memory. *Nature Materials* 7, 425-426 (2008).
13. Chiba, D. et al. Magnetization vector manipulation by electric fields. *Nature* 455, 515-518 (2008).
14. He, X. et al. Robust isothermal electric control of exchange bias at room temperature. *Nature Materials* 9, 579-585 (2010).
15. Ohno, H. A window on the future of spintronics. *Nature Materials* 9, 952-954 (2010).
16. Spaldin, N. A. & Fiebig, M. The Renaissance of Magnetoelectric Multiferroics. *Science* 309, 391-392 (2005).
17. Hur, N. et al. Electric polarization reversal and memory in a multiferroic material induced by magnetic fields. *Nature* 429, 392-395 (2004).
18. Garcia, V. et al. Ferroelectric Control of Spin Polarization. *Science* 327, 1106-1110 (2010).
19. Chu, Y. -H. et al. Electric-field control of local ferromagnetism using a magnetoelectric multiferroic. *Nature Materials* 7, 478-482 (2008).
20. Lou, J., Liu, M., Reed, D., Ren, Y. H. & Sun, N. X. Giant Electric Field Tuning of Magnetism in Novel Multiferroic FeGaB/Lead Zinc Niobate-Lead Titanate (PZN-PT) Heterostructures. *Advanced Materials* 21, 4711-+(2009).
21. Ohno, H. et al. Electric-field control of ferromagnetism. *Nature* 408, 944-946 (2000).
22. Chiba, D., Yamanouchi, M., Matsukura, F. & Ohno, H. Electrical Manipulation of Magnetization Reversal in a Ferromagnetic Semiconductor. *Science* 301, 943-945 (2003).
23. Weisheit, M. et al. Electric Field-Induced Modification of Magnetism in Thin-Film Ferromagnets. *Science* 315, 349-351 (2007).
24. Maruyama, T. et al. Large voltage-induced magnetic anisotropy change in a few atomic layers of iron. *Nature Nanotechnology* 4, 158-161 (2009).
25. Ha, S. -S. et al. Voltage induced magnetic anisotropy change in ultrathin Fe[sub 80]Co[sub 20]/MgO junctions with Brillouin light scattering. *Applied Physics Letters* 96, 142512-3 (2010).
26. Shiota, Y. et al. Voltage-Assisted Magnetization Switching in Ultrathin Fe80Co20 Alloy Layers. *Applied Physics Express* 2, 063001 (2009).
27. Nozaki, T., Shiota, Y., Shiraishi, M., Shinjo, T. & Suzuki, Y. Voltage-induced perpendicular magnetic anisotropy change in magnetic tunnel junctions. *Applied Physics Letters* 96, 022506-3 (2010).
28. Endo, M., Kanai, S., Ikeda, S., Matsukura, F. & Ohno, H. Electric-field effects on thickness dependent magnetic anisotropy of sputtered MgO/Co[sub 40]Fe[sub 40]B[sub 20]/Ta structures. *Applied Physics Letters* 96, 212503-3 (2010).
29. Djayaprawira, D. D. et al. 230% room-temperature magnetoresistance in CoFeB/MgO/CoFeB magnetic tunnel junctions. *Applied Physics Letters* 86, 092502 (2005).
30. Nishimura, N. et al. Magnetic tunnel junction device with perpendicular magnetization films for high-density magnetic random access memory. *Journal of Applied Physics* 91, 5246-5249 (2002).
31. Yoshikawa, M. et al. Tunnel Magnetoresistance Over 100% in MgO-Based Magnetic Tunnel Junction Films With Perpendicular Magnetic L10-FePt Electrodes. *Magnetics, IEEE Transactions on Magnetics* 44, 2573-2576 (2008).
32. Yakushiji, K. et al. Ultrathin Co/Pt and Co/Pd superlattice films for MgO-based perpendicular magnetic tunnel junctions. *Applied Physics Letters* 97, 232508-3 (2010).
33. Niranjan, M. K., Duan, C. -G., Jaswal, S. S. & Tsymbal, E. Y. Electric field effect on magnetization at the Fe/MgO (001) interface. *Applied Physics Letters* 96, 222504-3 (2010).
34. Wang, W. G. et al. Understanding tunneling magnetoresistance during thermal annealing in MgO-based junctions with CoFeB electrodes. *Physical Review B* 81, 144406 (2010).
35. Butler, W. H., Zhang, X. -G., Schulthess, T. C. & MacLaren, J. M. Spin-dependent tunneling conductance of Fe|MgO|Fe sandwiches. *Physical Review B* 63, 054416 (2001).
36. Shimabukuro, R., Nakamura, K., Akiyama, T. & Ito, T. Electric field effects on magnetocrystalline anisotropy in ferromagnetic Fe monolayers. *Physica E: Low-dimensional Systems and Nanostructures* 42, 1014-1017 (2010).
37. Manchon, A. et al. Analysis of oxygen induced anisotropy crossover in Pt/Co/MOx trilayers. *Journal of Applied Physics* 104, 043914-7 (2008).
38. Ravelosona, D. et al. Domain Wall Creation in Nanostructures Driven by a Spin-Polarized Current. *Physical Review Letters* 96, 186604 (2006).
39. Worledge, D. C. et al. Spin torque switching of perpendicular Ta|CoFeB|MgO-based magnetic tunnel junctions. *Applied Physics Letters* 98, 022501-3 (2011).

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:
1. A magneto-electronic device, comprising:
   a first electrode;
   a second electrode spaced apart from said first electrode; and
   an electric-field-controllable magnetic tunnel junction arranged between said first electrode and said second electrode,
   wherein said electric-field-controllable magnetic tunnel junction comprises:
      a first ferromagnetic layer,
      an insulating layer formed on said first ferromagnetic layer,
      a second ferromagnetic layer formed on said insulating layer,
      a first interface between said insulating layer and said first ferromagnetic layer, said first interface having a magnetic anisotropy that is perpendicular to a plane of said first ferromagnetic layer, and
      a second interface between said insulating layer and said second ferromagnetic layer, said second interface having a magnetic anisotropy that is perpendicular to a plane of said second ferromagnetic layer,
wherein said first and second ferromagnetic layers have respective first and second magnetic anisotropies that are alignable substantially parallel to each other in a first state and substantially antiparallel in a second state of said electric-field-controllable magnetic tunnel junction,
wherein a current of tunneling electrons through said insulating layer is greater in said first state than said second state, and
wherein said electric-field-controllable magnetic tunnel junction is configured such that at least one of a magnetic anisotropy energy, coercivity or domain wall velocity of at least one of said first and second ferromagnetic layers changes when a voltage is applied between said first and second electrodes.

2. A magneto-electronic device according to claim 1, wherein said second ferromagnetic layer is constructed to have a coercivity that increases with a change in said voltage applied between said first and second electrodes, and
wherein said first ferromagnetic layer is constructed to have a coercivity that decreases with said change in said voltage applied between said first and second electrodes.

3. A magneto-electronic device according to claim 1, further comprising a source of a bias magnetic field,
wherein said electric-field-controllable magnetic tunnel junction is arranged in said bias magnetic field such that said second anisotropy of said second ferromagnetic layer has parallel and antiparallel orientations relative to said bias magnetic field, and
wherein said voltage applied between said first and second electrodes causes a change in a coercivity of said second ferromagnetic layer to assist said bias magnetic field to change said second anisotropy of said second ferromagnetic layer from said antiparallel to said parallel orientation relative to said bias magnetic field while said first magnetic anisotropy of said first ferromagnetic layer remains unchanged in orientation.

4. A magneto-electronic device according to claim 3, wherein said source of said bias magnetic field provides a substantially constant magnetic field.

5. A magneto-electronic device according to claim 3, wherein said source of said bias magnetic field provides a changeable magnetic field.

6. A magneto-electronic device according to claim 1, wherein said first and second magnetic anisotropies of said first and second ferromagnetic layers are substantially perpendicular to said first and second ferromagnetic layers.

7. A magneto-electronic device according to claim 1, wherein said insulating layer is a MgO insulating layer.

8. A magneto-electronic device according to claim 7, wherein said first and second ferromagnetic layers are $Co_{40}Fe_{40}B_{20}$ ferromagnetic layers.

9. A magneto-electronic device according to claim 8, wherein said first ferromagnetic layer has a thickness of at least 1.0 nm and less than 1.5 nm, and
wherein said second ferromagnetic layer has a thickness of at least 1.5 nm and less than 1.8 nm.

10. A magneto-electronic device according to claim 8, wherein said first ferromagnetic layer has a thickness of at least 0.7 nm and less than 1.2 nm, and
wherein said second ferromagnetic layer has a thickness of at least 1.6 nm and less than 1.7 nm.

11. A magneto-electronic device according to claim 8, wherein said MgO insulating layer has a thickness of at least 1.0 nm and less than 2.0 nm.

12. A magneto-electronic device according to claim 11, wherein said MgO insulating layer has a thickness of about 1.4 nm.

13. A magneto-electronic device according to claim 12, wherein said first ferromagnetic layer has a thickness of at least 0.7 nm and less than 1.2 nm, and
wherein said second ferromagnetic layer has a thickness of at least 1.6 nm and less than 1.7 nm.

14. A magneto-electronic device according to claim 1, wherein said insulating layer consists essentially of MgO, AlO, $HfO_2$, $Ta_2O_5$, ZrO, or any combination thereof.

15. A magneto-electronic device according to claim 1, further comprising a plurality of electric-field-controllable magnetic tunnel junctions arranged between respective pairs of electrodes such that said magneto-electronic device is a non-volatile data storage device.

16. An electric-field-controllable magnetic tunnel junction, comprising:
a first ferromagnetic layer;
an insulating layer formed on said first ferromagnetic layer;
a second ferromagnetic layer formed on said insulating layer;
a first interface between said insulating layer and said first ferromagnetic layer, said first interface having a magnetic anisotropy that is perpendicular to a plane of said first ferromagnetic layer; and
a second interface between said insulating layer and said second ferromagnetic layer, said second interface having a magnetic anisotropy that is perpendicular to a plane of said second ferromagnetic layer,
wherein said first and second ferromagnetic layers have respective first and second magnetic anisotropies that are alignable substantially parallel to each other in a first state and substantially antiparallel in a second state of said electric-field-controllable magnetic tunnel junction,
wherein a current of tunneling electrons through said insulating layer is greater in said first state than said second state, and
wherein said electric-field-controllable magnetic tunnel junction is configured such that a coercivity of at least one of said first and second ferromagnetic layers changes when an electric field is applied to said electric-field-controllable magnetic tunnel junction.

17. An electric-field-controllable magnetic tunnel junction according to claim 16, wherein said first and second magnetic anisotropies of said first and second ferromagnetic layers are substantially perpendicular to said first and second ferromagnetic layers.

18. An electric-field-controllable magnetic tunnel junction according to claim 16, wherein said insulating layer is a MgO insulating layer.

19. An electric-field-controllable magnetic tunnel junction according to claim 18, wherein said first and second ferromagnetic layers are $Co_{40}Fe_{40}B_{20}$ ferromagnetic layers.

20. An electric-field-controllable magnetic tunnel junction according to claim 19, wherein said first ferromagnetic layer has a thickness of at least 1.0 nm and less than 1.5 nm, and
wherein said second ferromagnetic layer has a thickness of at least 1.5 nm and less than 1.8 nm.

21. An electric-field-controllable magnetic tunnel junction according to claim 19, wherein said first ferromagnetic layer has a thickness of at least 0.7 nm and less than 1.2 nm, and
wherein said second ferromagnetic layer has a thickness of at least 1.6 nm and less than 1.7 nm.

22. An electric-field-controllable magnetic tunnel junction according to claim 19, wherein said MgO insulating layer has a thickness of at least 1.0 nm and less than 2.0 nm.

23. An electric-field-controllable magnetic tunnel junction according to claim 22, wherein said MgO insulating layer has a thickness of about 1.4 nm.

24. An electric-field-controllable magnetic tunnel junction according to claim 23, wherein said first ferromagnetic layer has a thickness of at least 0.7 nm and less than 1.2 nm, and
wherein said second ferromagnetic layer has a thickness of at least 1.6 nm and less than 1.7 nm.

25. An electric-field-controllable magnetic tunnel junction according to claim 16, wherein said insulating layer consists essentially of MgO, AlO, $HfO_2$, $Ta_2O_5$, ZrO, or any combination thereof.

26. A method of producing a magneto-electronic device having an electric-field-controllable magnetic tunnel junction, comprising:
    forming a first electrode on a substrate;
    forming a first ferromagnetic layer on said first electrode;
    forming an insulating layer on said first ferromagnetic layer;
    forming a second ferromagnetic layer on said insulating layer;
    forming a second electrode on said second ferromagnetic layer; and
    annealing under a magnetic field that is perpendicular to at least one of the first and second ferromagnetic layers,
    wherein said forming said insulating layer forms a layer of MgO that has a thickness of at least 1.0 nm and less than 2.0 nm,
    wherein said forming said first ferromagnetic layer forms a layer of $Co_{40}Fe_{40}B_{20}$ that has a thickness of at least 0.7 nm and less than 1.5 nm, and
    wherein said forming said second ferromagnetic layer forms a layer of $Co_{40}Fe_{40}B_{20}$ that has a thickness of at least 1.5 nm and less than 1.8 nm.

27. A method of producing a magneto-electronic device according to claim 26, wherein said forming said first ferromagnetic layer forms a layer of $Co_{40}Fe_{40}B_{20}$ that has a thickness of at least 1.0 nm and less than 1.2 nm, and
    wherein said forming said second ferromagnetic layer forms a layer of $Co_{40}Fe_{40}B_{20}$ that has a thickness of at least 1.6 nm and less than 1.7 nm.

28. A method of producing a magneto-electronic device according to claim 27, wherein said forming said insulating layer forms a layer of MgO that has a thickness of about 1.4 nm.

29. A magneto-electronic device having an electric-field-controllable magnetic tunnel junction produced according to the method of claim 26.

* * * * *